United States Patent

Ogawa et al.

(10) Patent No.: US 9,455,149 B2
(45) Date of Patent: Sep. 27, 2016

(54) PLATE-LIKE OBJECT PROCESSING METHOD

(71) Applicant: DISCO CORPORATION, Tokyo (JP)

(72) Inventors: Yuki Ogawa, Tokyo (JP); Yuki Ishida, Tokyo (JP); Tsubasa Obata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/637,854

(22) Filed: Mar. 4, 2015

(65) Prior Publication Data

US 2015/0255288 A1   Sep. 10, 2015

(30) Foreign Application Priority Data

Mar. 6, 2014   (JP) ................. 2014-043486

(51) Int. Cl.
| | |
|---|---|
| *H01L 21/268* | (2006.01) |
| *H01L 21/78* | (2006.01) |
| *H01L 21/67* | (2006.01) |
| *B23K 26/00* | (2014.01) |
| *B23K 26/03* | (2006.01) |
| *B23K 26/08* | (2014.01) |

(52) U.S. Cl.
CPC ......... *H01L 21/268* (2013.01); *B23K 26/0057* (2013.01); *B23K 26/032* (2013.01); *B23K 26/0622* (2015.10); *B23K 26/0853* (2013.01); *H01L 21/67092* (2013.01); *H01L 21/78* (2013.01)

(58) Field of Classification Search
CPC   H01L 21/268; H01L 21/78; H01L 21/67092
USPC ........................................................ 438/462
See application file for complete search history.

(56) References Cited

U.S. PATENT DOCUMENTS

| | | | | |
|---|---|---|---|---|
| 5,922,224 A | * | 7/1999 | Broekroelofs | ..... B23K 26/0608 219/121.72 |
| 7,947,920 B2 | * | 5/2011 | Van Borkulo | ..... B23K 26/0652 219/121.68 |
| 2002/0031899 A1 | * | 3/2002 | Manor | ............... B23K 26/0093 438/460 |
| 2006/0019474 A1 | * | 1/2006 | Inui | .................... B23K 26/0604 438/487 |
| 2006/0148210 A1 | * | 7/2006 | Furuta | ................ B23K 26/0604 438/460 |
| 2010/0297831 A1 | * | 11/2010 | Morikazu | ......... H01L 21/67132 438/463 |
| 2010/0297855 A1 | * | 11/2010 | Morikazu | ............ B23K 26/032 438/795 |
| 2010/0311225 A1 | * | 12/2010 | Sekiya | ................ B23K 26/367 438/463 |
| 2010/0317172 A1 | * | 12/2010 | Morikazu | .......... B23K 26/0608 438/463 |

FOREIGN PATENT DOCUMENTS

JP   2005-142398   6/2005

* cited by examiner

*Primary Examiner* — Fernando L Toledo
*Assistant Examiner* — Adam S Bowen
(74) *Attorney, Agent, or Firm* — Greer Burns & Crain, Ltd.

(57) ABSTRACT

A plate-like object processing method for processing a plate-like object including a substrate and a laminate formed on a front surface of the substrate, includes a substrate exposing step of exposing the substrate by removing the laminate by irradiating a region in which the laminate of the plate-like object is desired to be removed with a laser beam set at an energy density that destroys the laminate but does not destroy the substrate.

15 Claims, 8 Drawing Sheets

PLATE-LIKE OBJECT PROCESSING METHOD

BACKGROUND OF THE INVENTION

1. Field of the Invention

The present invention relates to a plate-like object processing method for exposing a substrate such as silicon or the like by removing a laminate formed on a front surface of the substrate, the plate-like object including the substrate and the laminate.

2. Description of the Related Art

As is well known to those skilled in the art, a semiconductor device manufacturing process forms a semiconductor wafer in which a plurality of devices such as ICs, LSIs, or the like are formed in a matrix manner by a functional layer obtained by laminating an insulating film and a functional film on a front surface of a substrate such as silicon or the like. The devices in the thus formed semiconductor wafer are partitioned by division lines referred to as streets. The individual semiconductor devices are manufactured by dividing the devices from each other along the division lines.

Recently, in order to improve the throughput of a semiconductor chip such as an IC, an LSI, or the like, a semiconductor wafer has been put to practical use in which semiconductor devices are formed by a functional layer including a low dielectric constant insulator film (Low-k film) laminated on the front surface of a substrate such as silicon or the like, the low dielectric constant insulator film being formed of a film of an inorganic material such as SiOF, BSG (SiOB), or the like, or a film of an organic material as a polyimide-based polymer film, a parylene-based polymer film, or the like.

Division along the streets of such a semiconductor wafer is generally performed by a cutting device referred to as a dicing saw. This cutting device includes a chuck table holding the semiconductor wafer as a workpiece, cutting means for cutting the semiconductor wafer held on the chuck table, and moving means for moving the chuck table and the cutting means relative to each other. The cutting means includes a rotary spindle rotated at a high speed and a cutting blade mounted on the spindle. The cutting blade includes a disk-shaped base and an annular cutting edge mounted on the side surface of an outer circumferential portion of the base. The cutting edge is for example formed by fixing diamond abrasive grains having a grain size of about 3 $\mu$m by electroforming.

However, the above-described Low-k film is difficult to cut by the cutting blade. That is, the Low-k film is very fragile like mica. Therefore, when the semiconductor wafer is cut along the division lines by the cutting blade, the Low-k film peels off, and this peeling reaches the devices and causes a fatal damage to the devices.

In order to solve this problem, Japanese Patent Laid-Open No. 2005-142398 discloses a wafer dividing method including irradiating both sides in a width direction of a division line formed on a semiconductor wafer with a laser beam along the division line, thereby dividing a laminate along the division line by removal, and positioning a cutting blade between the outsides of the two laser processed grooves and moving the cutting blade and the semiconductor wafer relative to each other, thereby cutting the semiconductor wafer along the division line.

SUMMARY OF THE INVENTION

However, when the substrate such as silicon or the like is exposed by removing the laminate by the application of the laser beam along the division line, an upper surface of the substrate is damaged by leakage light or direct rays of the laser beam. When the substrate is cut by the cutting blade along the division line in which the laminate is removed, a crack occurs from the damaged upper surface, and therefore decreases the transverse rupture strength of the device. Such a problem can generally happen in the processing of removing a laminate composed of a metallic film such as a TEG (Test Element Group) or the like, a passivation film and the like from a plate-like object having the laminate formed on the upper surface of the substrate.

It is accordingly an object of the present invention to provide a plate-like object processing method that can expose a substrate such as silicon or the like by removing a laminate formed on a front surface of the substrate without damaging the substrate, in a plate-like object including the substrate and the laminate.

In accordance with an aspect of the present invention, there is provided a plate-like object processing method for processing a plate-like object including a substrate and a laminate formed on a front surface of the substrate, the plate-like object processing method including a substrate exposing step of exposing the substrate by removing the laminate by irradiating a region in which the laminate of the plate-like object is desired to be removed with a laser beam set at an energy density that destroys the laminate but does not destroy the substrate.

Preferably, the laser beam applied in the substrate exposing step is applied, as a focused spot whose focal point is positioned above an upper surface of the laminate, to the upper surface of the laminate forming the plate-like object.

Preferably, the plate-like object is a wafer including the laminate in which a plurality of devices are formed in a state of being partitioned by a plurality of division lines on the front surface of the substrate, and a cutting step of cutting the exposed substrate along the division lines after removing the laminate along the division lines in the substrate exposing step is performed.

The plate-like object processing method according to the present invention performs the substrate exposing step of exposing the substrate by removing the laminate by irradiating a region in which the laminate of the plate-like object is desired to be removed with a laser beam set at an energy density that destroys the laminate but does not destroy the substrate. The plate-like object processing method can therefore remove the laminate without damaging the substrate. Because the laminate can be thus removed without the substrate being damaged, no crack occurs in the substrate and therefore the transverse rupture strength of the devices is not decreased even when the exposed substrate is cut along the division lines by a cutting blade.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
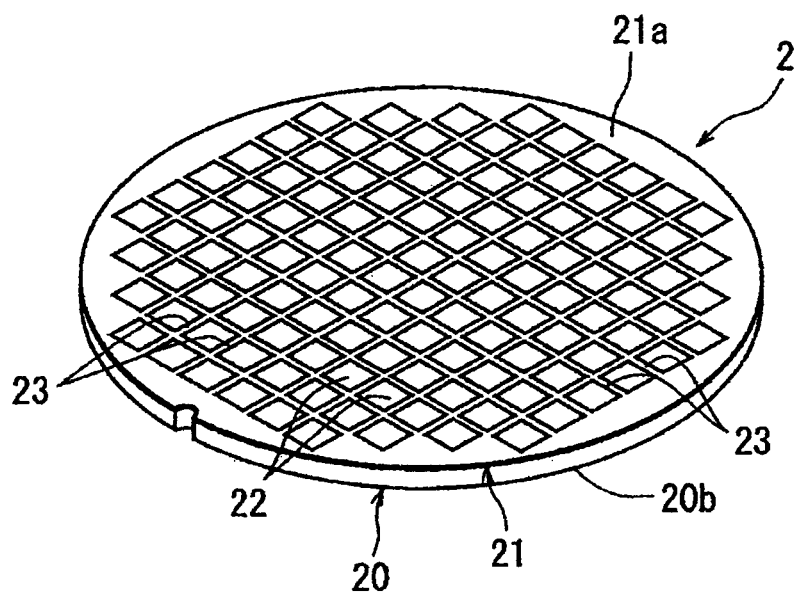
FIG. 1A is a perspective view of a semiconductor wafer as a plate-like object processed by a plate-like object processing method according to the present invention.
Figure 1B:
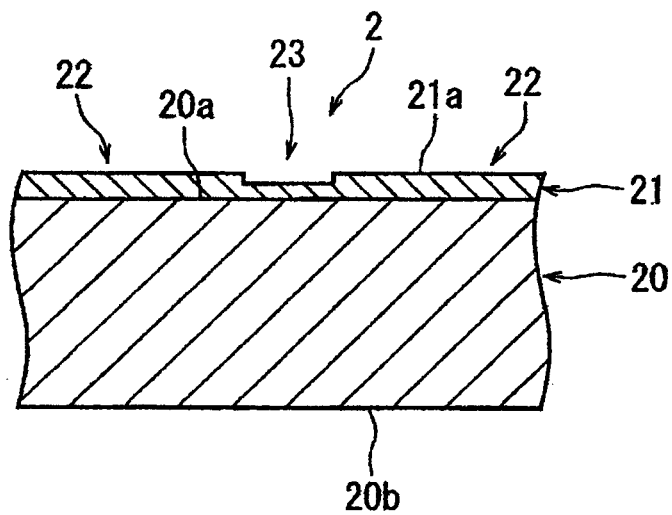
FIG. 1B is an enlarged sectional view showing an essential part of the semiconductor wafer.

A plate-like object processing method according to the present invention will hereinafter be described in further detail with reference to the accompanying drawings. FIG. 1A and FIG. 1B are a perspective view and an enlarged sectional view showing an essential part, respectively, of a semiconductor wafer as a plate-like object to be processed by the plate-like object processing method according to the present invention. A semiconductor wafer 2 shown in FIG. 1A has a plurality of devices 22 such as ICs, LSIs, or the like formed in a matrix manner by a functional layer 21 (laminate), which is formed by laminating an insulating film and a functional film forming a circuit on a front surface 20a of a substrate 20 such as silicon or the like having a thickness of 150 µm. The devices 22 are divided from each other by division lines 23 (whose width is set at 100 µm in the present embodiment) formed in a lattice manner. Incidentally, in the present embodiment, the insulating film forming the functional layer 21 is formed by a $SiO_2$ film or a low dielectric constant insulator film (Low-k film) formed of a film of an inorganic material such as SiOF, BSG (SiOB), or the like, or a film of an organic material as a polyimide-based polymer film, a parylene-based polymer film, or the like. The thickness of the insulating film is set at 10 µm.

Figure 2:
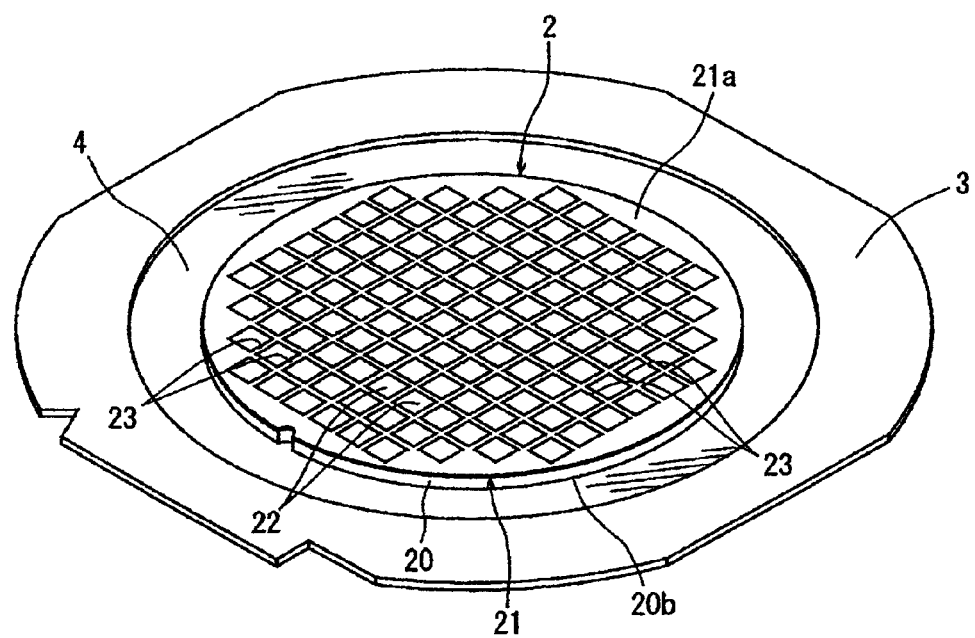
FIG. 2 is a perspective view showing a state in which a back surface of the semiconductor wafer that has been subjected to a wafer supporting process is stuck to a front surface of a dicing tape fitted to an annular frame.

Description will be made of the plate-like object processing method that removes the functional layer 21 as the laminate along the division lines 23 in the semiconductor wafer 2 as the above-described plate-like object. First, a wafer supporting process is performed which sticks a dicing tape to a back surface of the substrate 20 forming the semiconductor wafer 2, and supports an outer circumferential portion of the dicing tape by an annular frame. Specifically, as shown in FIG. 2, a back surface 20b of the substrate 20 forming the semiconductor wafer 2 is stuck to a front surface of a dicing tape 4 whose outer circumferential portion is fitted such that the dicing tape 4 covers an inside opening portion of an annular frame 3. Hence, a front surface 21a of the functional layer 21 as the laminate is on the upper side of the semiconductor wafer 2 stuck to the front surface of the dicing tape 4.

After the above-described wafer supporting process is performed, a substrate exposing process is performed which irradiates a region in which the functional layer 21 as the laminate is desired to be removed with a laser beam set at an energy density that destroys the functional layer 21 as the laminate but does not destroy the substrate 20, and thereby removes the functional layer 21 as the laminate to expose the substrate 20. This substrate exposing process is performed by using a laser processing device 5 shown in FIG. 3. The laser processing device 5 shown in FIG. 3 includes: a chuck table 51 holding a workpiece; laser beam irradiating means 52 for irradiating a workpiece held on the chuck table 51 with a laser beam; and imaging means 53 for imaging the workpiece held on the chuck table 51. The chuck table 51 is configured to suck and hold the workpiece. The chuck table 51 is moved by processing feed means not shown in the figures in a processing feed direction indicated by an arrow X in FIG. 3, and is moved by indexing feed means not shown in the figures in an indexing feed direction indicated by an arrow Y in FIG. 3.

Figure 4:
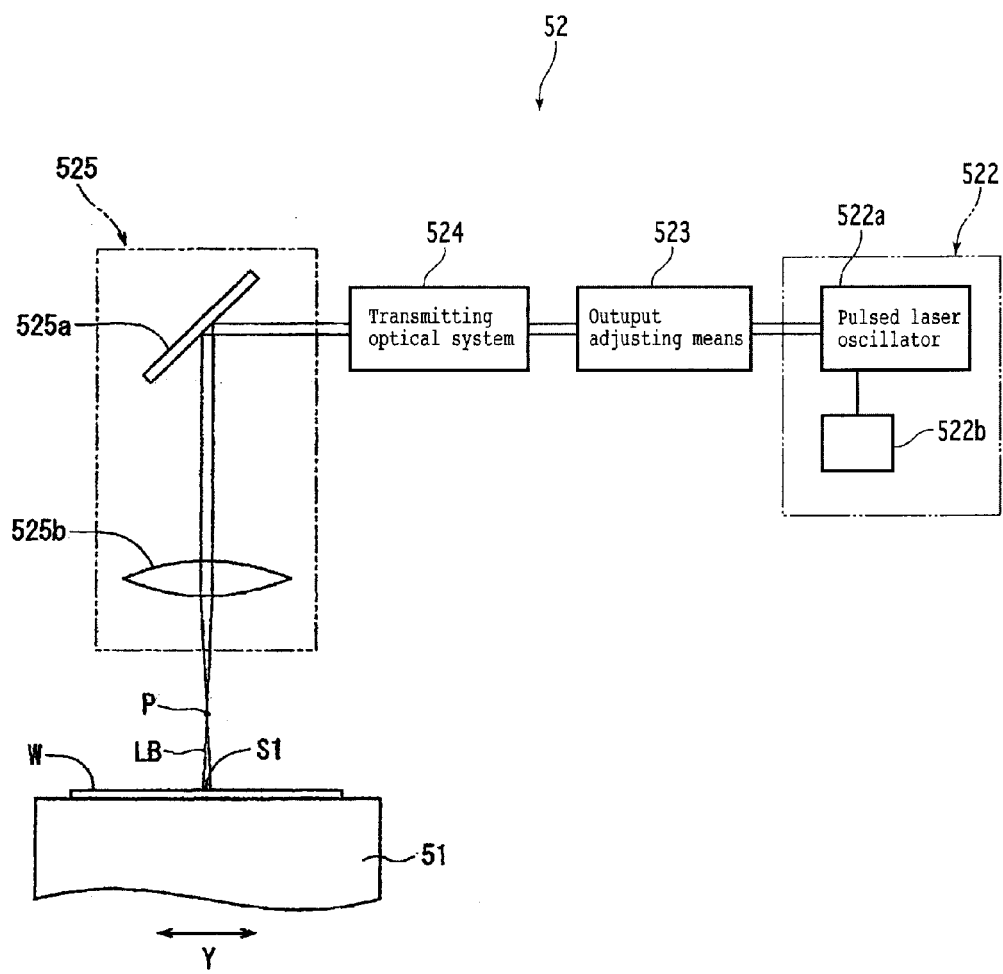
FIG. 4 is a configuration diagram of laser beam irradiating means provided to the laser processing device shown in FIG. 3.

The laser beam irradiating means 52 includes a cylindrical casing 521 arranged substantially horizontally. As shown in FIG. 4, arranged within the casing 521 are: pulsed laser beam oscillating means 522; output adjusting means 523 for adjusting the output of a pulsed laser beam oscillated by the pulsed laser beam oscillating means 522; and a transmitting optical system 524 that transmits the pulsed laser beam whose output is adjusted by the output adjusting means 523. The pulsed laser beam oscillating means 522 includes a pulsed laser oscillator 522a and repetition frequency setting means 522b attached to the pulsed laser oscillator 522a. The pulsed laser beam oscillated by the thus configured pulsed laser beam oscillating means 522 is adjusted in output by the output adjusting means 523, and is then guided to focusing means 525 mounted on an end of the casing 521 via the transmitting optical system 524.

As shown in FIG. 4, the focusing means 525 includes a direction changing mirror 525a and an objective lens 525b. The direction changing mirror 525a changes the direction of the pulsed laser beam guided via the transmitting optical system 524 at a right angle toward the objective lens 525b. The objective lens 525b focuses the pulsed laser beam whose direction is changed by the direction changing mirror 525a onto an upper surface of a workpiece W held on the chuck table 51. A focused spot S1 of a pulsed laser beam LB focused onto the upper surface of the workpiece W is formed so as to be 40 to 50 µm in diameter in the present embodiment. It is to be noted that the pulsed laser beam LB in the embodiment shown in FIG. 4 is applied as the focused spot S1 having a larger diameter than a focal point P located above the upper surface of the workpiece W (upper surface of the laminate forming the plate-like object).

The imaging means 53 mounted on an end portion of the casing 521 forming the laser beam irradiating means 52 includes illuminating means for illuminating the workpiece, an optical system capturing a region illuminated by the illuminating means, an imaging element (CCD) imaging an image captured by the optical system, and the like. The imaging means 53 sends the imaged image signal to control means not shown in the figure.

Referring to FIG. 3 and FIGS. 5A to 5D, description will be made of the substrate exposing process that positions the spot of the pulsed laser beam on an upper surface of one of the division lines 23 and applies the pulsed laser beam along the division line 23 using the above-described laser processing device 5, and thereby removes the functional layer 21 as the laminate laminated in the division line 23 to expose the substrate 20.

Figure 3:
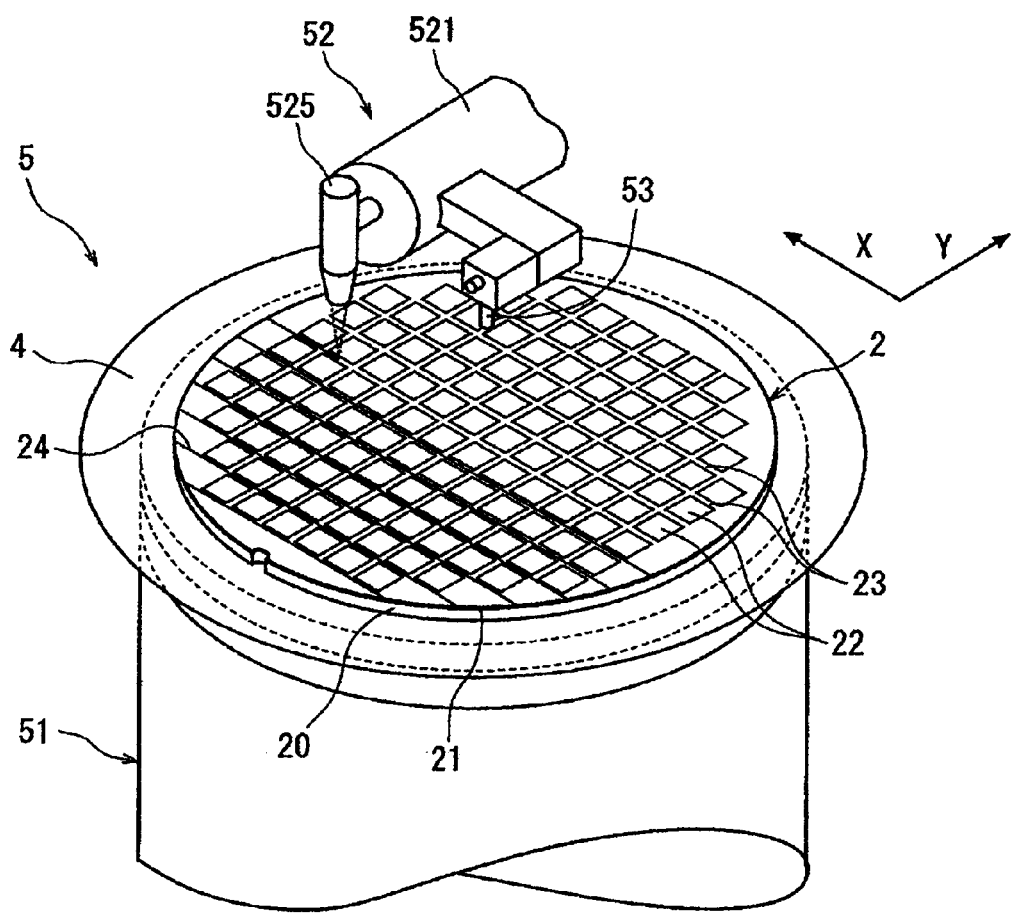
FIG. 3 is a perspective view showing an essential part of a laser processing device for performing a substrate exposing process.

First, the side of the dicing tape 4 to which the semiconductor wafer 2 that has been subjected to the above-described wafer supporting process is stuck is mounted on the chuck table 51 of the laser processing device 5 shown in FIG. 3 described above. Then, the semiconductor wafer 2 is held on the chuck table 51 via the dicing tape 4 by actuating suction means not shown in the figure (wafer holding process). Hence, the functional layer 21 is on the upper side of the semiconductor wafer 2 held by the chuck table 51. Incidentally, while the annular frame 3 to which the dicing tape 4 is fitted is not shown in FIG. 3, the annular frame 3 is held by appropriate frame holding means provided to the chuck table 51. The chuck table 51 thus sucking and holding the semiconductor wafer 2 is positioned directly under the imaging means 53 by the processing feed means not shown in the figure.

After the chuck table 51 is positioned directly under the imaging means 53, alignment operation is performed in which a processing region to be subjected to laser processing in the semiconductor wafer 2 is detected by the imaging means 53 and the control means not shown in the figures. Specifically, the imaging means 53 and the control means not shown in the figures perform image processing such as pattern matching or the like for alignment between a division line 23 formed in a first direction of the semiconductor wafer 2 and the focusing means 525 of the laser beam irradiating means 52 that applies the laser beam along the division line 23, and thereby carries out alignment of a laser beam irradiation position (alignment step). In addition, the alignment of the laser beam irradiation position is similarly carried out for a division line 23 formed in a direction orthogonal to the first direction in the semiconductor wafer 2.

Figure 5A:
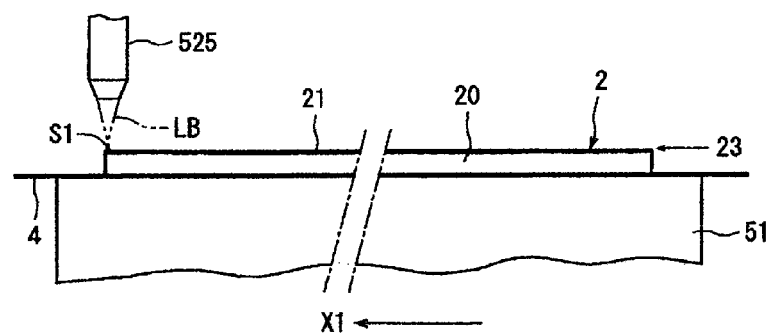
FIGS. 5A to 5D are diagrams of assistance in explaining the substrate exposing process.
Figure 5B:
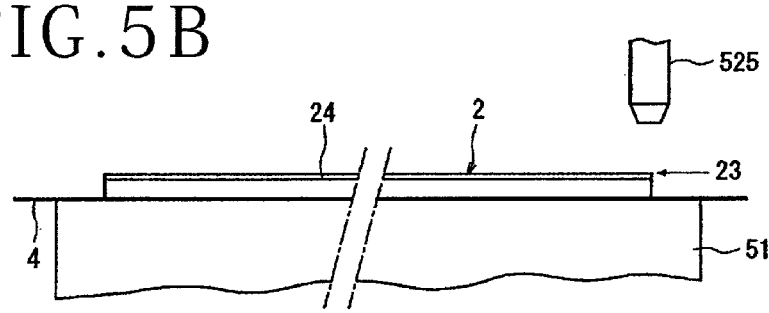
Figure 5C:
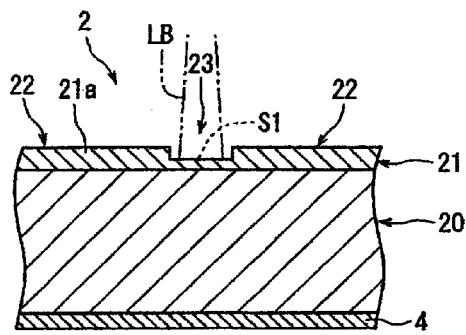

After the above-described alignment step is performed, the chuck table 51 is moved to a laser beam irradiation region in which the focusing means 525 of the laser beam irradiating means 52 that applies the pulsed laser beam is located, and a predetermined division line 23 is positioned directly under the focusing means 525, as shown in FIG. 5A. At this time, as shown in FIG. 5A, the semiconductor wafer 2 is positioned such that one end (left end in FIG. 5A) of the division line 23 is located directly under the focusing means 525. Then, as shown in FIG. 5A and FIG. 5C, the focused spot S1 of the pulsed laser beam LB applied from the focusing means 525 is positioned in the vicinity of the upper surface of the functional layer 21 in the division line 23. Next, the chuck table 51 is moved in a direction indicated by an arrow X1 in FIG. 5A at a predetermined processing feed speed while the pulsed laser beam LB set at an energy density that destroys the functional layer 21 forming the semiconductor wafer 2 but does not destroy the substrate 20 is applied from the focusing means 525 of the laser beam irradiating means 52. Then, after another end (right end in FIG. 5B) of the division line 23 formed in the semiconductor wafer 2 reaches the position directly under the focusing means 525 as shown in FIG. 5B, the application of the pulsed laser beam LB is stopped, and the movement of the chuck table 51 is stopped.

Figure 5D:
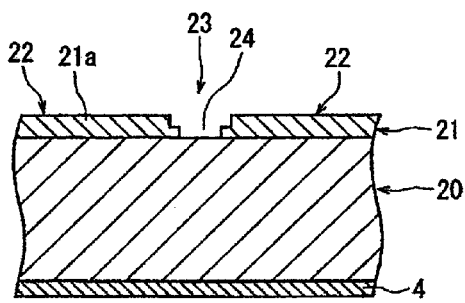

The substrate exposing step is performed under the following processing conditions, for example.
(First Processing Conditions)
Wavelength of the pulsed laser beam: 355 nm
Repetition frequency: 200 to 1000 kHz
Pulse width: 1 to 5 ns
Energy density: 0.6 to 1.5 J/cm$^2$
Spot diameter: 40 to 50 µm
Processing feed speed: 100 to 400 mm/sec
(Second Processing Conditions)
Wavelength of the pulsed laser beam: 532 nm
Repetition frequency: 10 MHz
Pulse width: 10 ps
Energy density: 0.13 to 0.2 J/cm$^2$
Spot diameter: 40 to 50 µm
Processing feed speed: 500 mm/sec In the above-described substrate exposing step, the pulsed laser beam LB is set at the energy density that destroys the functional layer 21 but does not destroy the substrate 20. Thus, the functional layer 21 undergoes ablation processing, but the substrate 20 is not damaged. It is to be noted that in the present embodiment, as shown in FIG. 4, the focal point P of the pulsed laser beam LB is positioned above the upper surface of the workpiece W (upper surface of the functional layer 21 of the semiconductor wafer 2), and the laser beam formed in a conical shape is applied in the state of the focused spot S1 to the upper surface of the functional layer 21. Therefore, when the functional layer 21 is removed and the upper surface of the substrate 20 is irradiated with the focused spot S1, the focused spot S1 has a larger diameter than in the state of being applied to the functional layer 21, and is thus increased in area. Hence, the energy density of the pulsed laser beam LB applied to the substrate 20 is lowered, so that damage to the substrate 20 is prevented reliably. As a result, as shown in FIG. 5D, a groove 24 in which the functional layer 21 is removed is formed in the division line 23 of the semiconductor wafer 2, and the front surface 20a (upper surface) of the substrate 20 is exposed without the substrate 20 being damaged. This substrate exposing step is performed along all of the division lines 23 formed in the semiconductor wafer 2.

Figure 6:
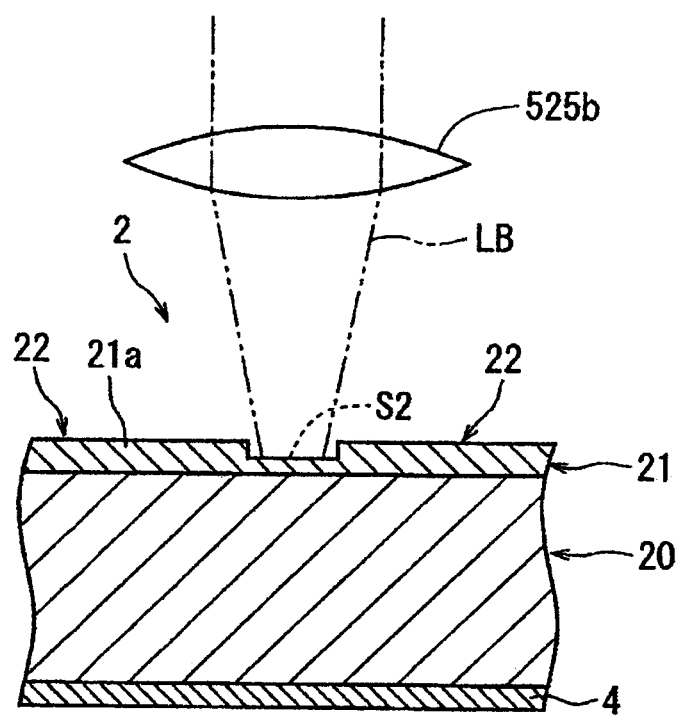
FIG. 6 is a diagram of assistance in explaining another embodiment of the substrate exposing process.

Incidentally, while an example of irradiating the upper surface of the functional layer 21 of the semiconductor wafer 2 with the focused spot S1 of the pulsed laser beam LB has been illustrated in the above-described embodiment, the upper surface of the functional layer 21 of the semiconductor wafer 2 may be irradiated with a focused spot S2 on the objective lens 525b side of the focal point of the pulsed laser beam LB focused by the objective lens 525b, as shown in FIG. 6.

Figure 7:
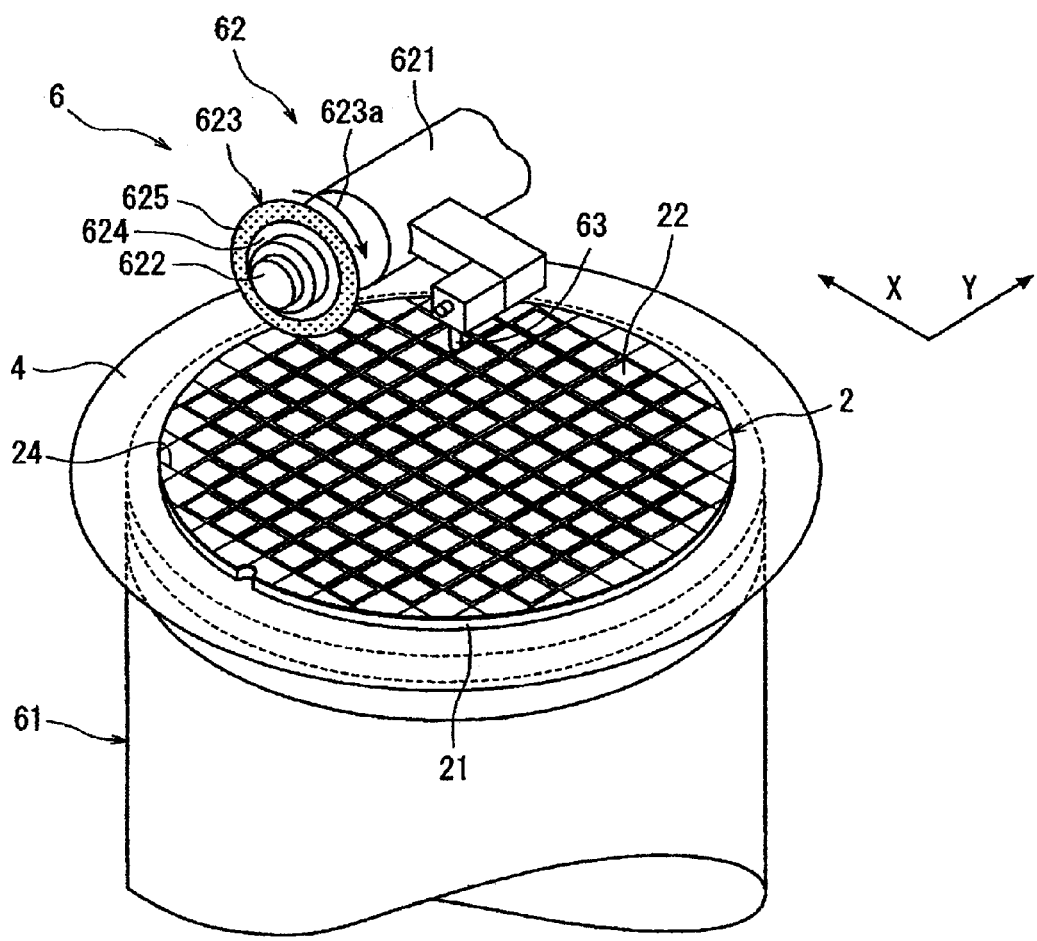
FIG. 7 is a perspective view showing an essential part of a cutting device for performing a cutting process.

After the above-described substrate exposing step is performed, a substrate cutting step is performed which cuts the substrate 20 exposed along the groove 24 in which the functional layer 21 of the semiconductor wafer 2 is removed. This substrate cutting step is performed by using a cutting device 6 shown in FIG. 7 in the present embodiment. The cutting device 6 shown in FIG. 7 includes: a chuck table 61 holding a workpiece; cutting means 62 for cutting the workpiece held by the chuck table 61; and imaging means 63 for imaging the workpiece held by the chuck table 61. The chuck table 61 is configured to suck and hold the workpiece. The chuck table 61 is moved by processing feed means not shown in the figure in a processing feed direction indicated by an arrow X in FIG. 7, and is moved by indexing feed means not shown in the figures in an indexing feed direction indicated by an arrow Y.

The cutting means 62 includes: a spindle housing 621 disposed substantially horizontally; a rotary spindle 622 rotatably supported by the spindle housing 621; and a cutting blade 623 mounted on an end portion of the rotary spindle 622. The rotary spindle 622 is rotated in a direction indicated by an arrow 623a by a servomotor not shown in the figure which servomotor is disposed within the spindle housing 621. The cutting blade 623 includes a disk-shaped base 624 formed by a metallic material such as aluminum or the like and an annular cutting edge 625 mounted on the side surface of an outer circumferential portion of the base 624. The annular cutting edge 625 is formed by an electroformed blade obtained by binding diamond abrasive grains having a grain size of 3 to 4 µm on the side surface of the outer circumferential portion of the base 624 by nickel plating.

The annular cutting edge 625 in the embodiment shown in the figures is formed with a thickness of 30 μm and an outside diameter of 50 mm.

The imaging means 63 is mounted on an end portion of the spindle housing 621. The imaging means 63 includes illuminating means for illuminating the workpiece, an optical system capturing a region illuminated by the illuminating means, an imaging element (CCD) imaging an image captured by the optical system, and the like. The imaging means 63 sends the imaged image signal to control means not shown in the figures.

Figure 8A:
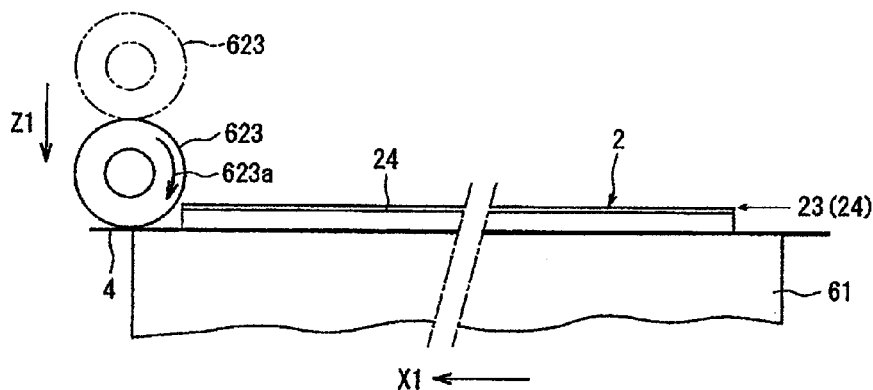
FIGS. 8A to 8D are diagrams of assistance in explaining the cutting process.

In order to perform the substrate cutting step using the above-described cutting device 6, as shown in FIG. 8A, the side of the dicing tape 4 to which the semiconductor wafer 2 that has been subjected to the above-described substrate exposing step is stuck is mounted on the chuck table 61. Then, the semiconductor wafer 2 is held on the chuck table 61 via the dicing tape 4 by actuating suction means not shown in the figure (wafer holding process). Hence, the grooves 24 formed along the division lines 23 are on the upper side of the semiconductor wafer 2 held by the chuck table 61. Incidentally, while the annular frame 3 to which the dicing tape 4 is fitted is not shown in FIG. 8A and FIG. 8B, the annular frame 3 is held by appropriate frame holding means provided to the chuck table 61. The chuck table 61 thus sucking and holding the semiconductor wafer 2 is positioned directly under the imaging means 63 by the processing feed means not shown in the figure.

After the chuck table 61 is positioned directly under the imaging means 63, an alignment step is performed in which a region to be cut in the semiconductor wafer 2 is detected by the imaging means 63 and the control means not shown in the figures. This alignment step is performed by imaging, by the imaging means 63, the grooves 24 formed along the division lines 23 of the semiconductor wafer 2 by the above-described substrate exposing step. Specifically, the imaging means 63 and the control means not shown in the figures perform image processing such as pattern matching or the like for alignment between a groove 24 formed along a division line 23 formed in the first direction of the semiconductor wafer 2 and the cutting blade 623, and thereby carries out alignment of a cutting region to be cut by the cutting blade 623 (alignment step). In addition, the alignment of the cutting region to be cut by the cutting blade 623 is similarly carried out for a groove 24 formed in the direction orthogonal to the first direction in the semiconductor wafer 2.

After the grooves 24 formed along the division lines 23 of the semiconductor wafer 2 held on the chuck table 61 are detected and the alignment of the cutting region is performed as described above, the chuck table 61 holding the semiconductor wafer 2 is moved to a cutting start position of the cutting region. At this time, as shown in FIG. 8A, the semiconductor wafer 2 is positioned such that one end (left end in FIG. 8A) of the groove 24 to be cut is located to the right of a position directly under the cutting blade 623 by a predetermined amount. At this time, in the embodiment shown in the figures, the cutting region is detected by directly imaging the grooves 24 formed in the division lines 23 in the above-described alignment process. Thus, the central position of the groove 24 formed in the division line 23 is surely positioned at a position opposed to the cutting blade 623.

Figure 8B:
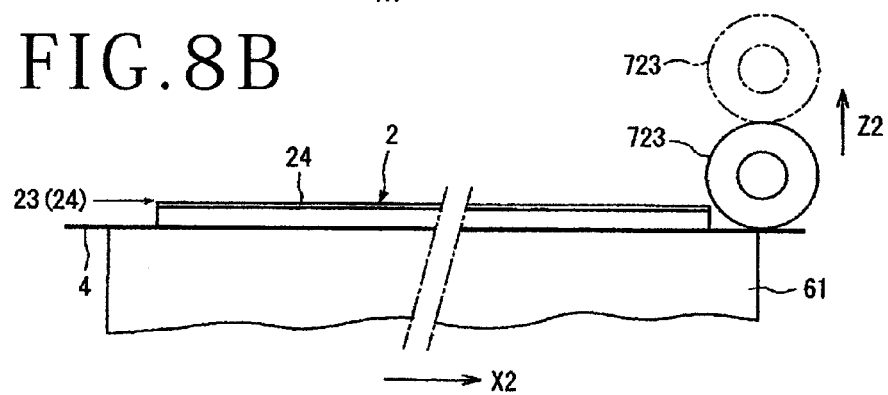
Figure 8C:
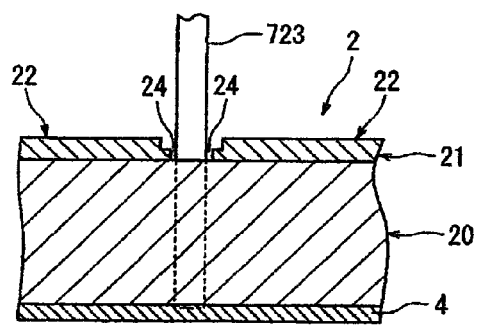

After the semiconductor wafer 2 held on the chuck table 61 of the cutting device 6 is thus positioned at the cutting start position of the cutting processing region, the cutting blade 623 is fed for cutting downward as indicated by an arrow Z1 from a standby position indicated by a chain double-dashed line in FIG. 8A, and is thereby positioned at a predetermined infeed position as indicated by a solid line in FIG. 8A. As shown in FIG. 8A and FIG. 8C, this infeed position is set such that a lower end of the cutting blade 623 reaches the dicing tape 4 stuck to the undersurface of the semiconductor wafer 2.

Figure 8D:
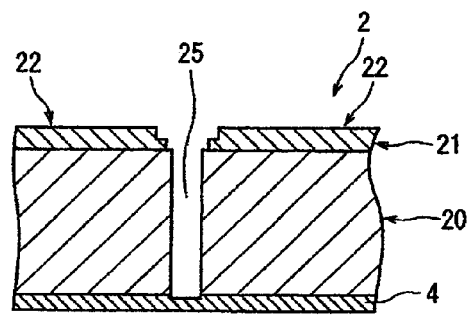

Next, the cutting blade 623 is rotated in a direction indicated by an arrow 623a in FIG. 8A at a fast rotational speed (for example 20000 rpm), and the chuck table 61 is moved in a direction indicated by an arrow X1 in FIG. 8A at a predetermined cutting feed speed. Then, when the chuck table 61 has reached a position such that another end (right end in FIG. 8B) of the groove 24 is located to the left of the position directly under the cutting blade 623 by a predetermined amount as shown in FIG. 8B, the movement of the chuck table 61 is stopped. As shown in FIG. 8D, thus feeding the chuck table 61 for cutting forms a cut groove 25 reaching the undersurface within the groove 24 formed in the division line 23, and therefore cuts the substrate 20 of the semiconductor wafer 2 (substrate cutting step).

Next, the cutting blade 623 is positioned at the standby position indicated by a chain double-dashed line by raising the cutting blade 623 as indicated by an arrow Z2 in FIG. 8B, and the chuck table 61 is moved in a direction indicated by an arrow X2 in FIG. 8B to be returned to the position shown in FIG. 8A. Then, the chuck table 61 is indexed by an amount corresponding to the intervals between the grooves 24 in a direction (indexing direction) perpendicular to the page. A groove 24 to be cut next is thereby positioned at the position corresponding to the cutting blade 623. After the groove 24 to be cut next is thus positioned at the position corresponding to the cutting blade 623, the above-described cutting step is performed.

The above-described dividing step is performed under the following processing conditions, for example. Cutting blade: an outside diameter of 50 mm and a thickness of 30 μm Rotational speed of the cutting blade: 20000 rpm
Cutting feed speed: 50 mm/sec The above-described dividing step is performed on the grooves 24 formed along all of the division lines 23 formed in the semiconductor wafer 2. As a result, the substrate 20 of the semiconductor wafer 2 is cut along the division lines 23 in which the grooves 24 are formed, and is thus divided into individual devices 22. The thus divided devices 22 are not decreased in transverse rupture strength because the application of the pulsed laser beam LB in the above substrate exposing process causes no damage to the substrate 20.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A plate-like object processing method for processing a plate-like object including a substrate and a laminate formed on a front surface of the substrate, the plate-like object processing method comprising:
    a substrate exposing step of exposing the substrate by removing the laminate by irradiating a region in which the laminate of the plate-like object is desired to be removed with a single laser beam set at an energy density that destroys the laminate but does not destroy the substrate, wherein the single laser beam comprises a single beam spot of a predetermining diameter that is irradiated upon an upper surface of the laminate, wherein the wavelength of the single laser beam is either 355 nm or 532 nm.

2. The plate-like object processing method according to claim 1, wherein:
the laser beam applied in the substrate exposing step is applied, as the single beam spot whose focal point is positioned above an upper surface of the laminate, to the upper surface of the laminate forming the plate-like object.

3. The plate-like object processing method according to claim 1, wherein:
the plate-like object is a wafer including the laminate in which a plurality of devices are formed in a state of being partitioned by a plurality of division lines on the front surface of the substrate, and
the plate-like object processing method further comprises:
a cutting step of cutting the exposed substrate along the division lines after removing the laminate along the division lines in the substrate exposing step.

4. A plate-like object processing method for processing a plate-like object including a substrate and a laminate formed on a front surface of the substrate, the plate-like object processing method comprising:
guiding a single laser beam from a pulsed laser beam oscillating means to a focusing means, wherein said focusing means directs said laser beam from a mirror directly to an objective lens; and
a substrate exposing step of exposing the substrate by removing the laminate by irradiating a region in which the laminate of the plate-like object is desired to be removed with the laser beam being set at an energy density that destroys the laminate but does not destroy the substrate,
wherein the wavelength of the single laser beam is either 355 nm or 532 nm.

5. The plate-like object processing method according to claim 4, wherein:
the laser beam applied in the substrate exposing step is applied, as a focused spot whose focal point is positioned above an upper surface of the laminate, to the upper surface of the laminate forming the plate-like object.

6. The plate-like object processing method according to claim 4, wherein:
the plate-like object is a wafer including the laminate in which a plurality of devices are formed in a state of being partitioned by a plurality of division lines on the front surface of the substrate, and
the plate-like object processing method further comprises:
a cutting step of cutting the exposed substrate along the division lines after removing the laminate along the division lines in the substrate exposing step.

7. The plate-like object processing method according to claim 1, wherein the predetermined diameter of the single beam spot is between 40 and 50 μm.

8. The plate-like object processing method according to claim 1, wherein the single laser beam has a conical shape in the area above the upper surface of the laminate.

9. The plate-like object processing method according to claim 4, wherein the laser beam has a conical shape in the area between the objective lens and the laminate.

10. The plate-like object processing method according to claim 1, wherein:
the wavelength of the single laser beam is 355 nm; and
the energy density of the single laser beam is within the range of 0.6 to 1.5 J/cm$^2$.

11. The plate-like object processing method according to claim 4, wherein:
the wavelength of the single laser beam is 355 nm; and
the energy density of the single laser beam is within the range of 0.6 to 1.5 J/cm$^2$.

12. The plate-like object processing method according to claim 1, wherein:
the wavelength of the single laser beam is 532 nm; and
the energy density of the single laser beam is within the range of 0.13 to 0.2 J/cm$^2$.

13. The plate-like object processing method according to claim 4, wherein:
the wavelength of the single laser beam is 532 nm; and
the energy density of the single laser beam is within the range of 0.13 to 0.2 J/cm$^2$.

14. The plate-like object processing method according to claim 1, wherein the substrate is formed of silicon.

15. The plate-like object processing method according to claim 4, wherein the substrate is formed of silicon.

* * * * *